US009557378B2

United States Patent
Bickford et al.

(10) Patent No.: US 9,557,378 B2
(45) Date of Patent: Jan. 31, 2017

(54) METHOD AND STRUCTURE FOR MULTI-CORE CHIP PRODUCT TEST AND SELECTIVE VOLTAGE BINNING DISPOSITION

(75) Inventors: Jeanne P. Bickford, Essex Junction, VT (US); Vikram Iyengar, Pittsburgh, PA (US); Rahul K. Nadkarni, Greenville, NC (US); Pascal A. Nsame, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 749 days.

(21) Appl. No.: 13/553,986

(22) Filed: Jul. 20, 2012

(65) Prior Publication Data
US 2014/0024145 A1 Jan. 23, 2014

(51) Int. Cl.
*H01L 21/66* (2006.01)
*G01R 31/02* (2006.01)
(Continued)

(52) U.S. Cl.
CPC ... *G01R 31/31718* (2013.01); *G01R 31/31725* (2013.01); *G06F 1/32* (2013.01)

(58) Field of Classification Search
CPC ......... G01R 31/02; G01R 31/26; G01R 27/28; G01R 31/00; G01R 31/14; G01R 31/31718; G01R 31/31725; G01N 37/00; G06F 9/455; G06F 17/50; G06F 1/32; H01L 21/00
(Continued)

(56) References Cited

U.S. PATENT DOCUMENTS 3,146,137 A * 8/1964 Williams .............. H01L 29/045
    117/101
3,303,931 A * 2/1967 Vaughan ............ G01R 31/2601
    209/573
(Continued)

OTHER PUBLICATIONS

Ramakrishnan et al., "Model-Based Product Quantity Control", 1995 IEEE/CPMT Int'l Electronics Manufacturing Technology Symposium, p. 389-395.*
(Continued)

*Primary Examiner* — Patrick Assouad
*Assistant Examiner* — Haidong Zhang
(74) *Attorney, Agent, or Firm* — Gibb & Riley, LLC; Anthony J. Canale

(57) ABSTRACT

Operating speeds of integrated circuit devices are tested to establish maximum and minimum frequency at maximum and minimum voltage. The devices are sorted into relatively-slow and relatively-fast devices to classify the devices into different voltage bins. A bin-specific voltage limit is established for each of the voltage bins needed for core performance at system use conditions. The bin-specific voltage limit is compared to core minimum chip-level functionality voltage at system maximum and minimum frequency specifications. The method correlates system design evaluation of design maximum and minimum frequency at design maximum and minimum voltage conditions with evaluation of tested maximum and minimum frequency at tested maximum and minimum voltage conditions. A chip-specific functionality voltage limit is established for the device. Initial system voltage for all devices from a voltage bin is set at a greater of the bin-specific voltage limit and the chip-specific functionality voltage limit consistent with the evaluation conditions.

25 Claims, 5 Drawing Sheets

(51) Int. Cl.
*G06F 19/00* (2011.01)
*G01R 31/317* (2006.01)
*G06F 1/32* (2006.01)

(58) Field of Classification Search
USPC .......... 324/757.01, 757.03–767.05; 716/138, 716/113, 132, 134, 110; 414/222.01, 806, 414/788.7; 428/17, 14, 18; 702/117, 118, 702/81–84; 438/14–18, 460–464
See application file for complete search history.

(56) References Cited

U.S. PATENT DOCUMENTS

| | | | | |
|---|---|---|---|---|
| 4,406,373 | A * | 9/1983 | Braden | B07C 5/344 209/574 |
| 6,365,859 | B1 * | 4/2002 | Yi | B07C 5/344 209/573 |
| 7,013,441 | B2 | 3/2006 | Bickford et al. | |
| 7,109,737 | B2 * | 9/2006 | Arabi | G01R 31/30 324/762.02 |
| 7,475,366 | B2 | 1/2009 | Kuemerle et al. | |
| 7,496,692 | B2 | 2/2009 | Holm et al. | |
| 7,634,849 | B2 * | 12/2009 | Eldridge | G01R 1/07314 29/592.1 |
| 7,747,422 | B1 * | 6/2010 | Sisley | G06F 17/50 703/13 |
| 7,810,054 | B2 * | 10/2010 | Anemikos | G06F 17/5045 716/100 |
| 7,877,714 | B2 | 1/2011 | Anemikos et al. | |
| 8,249,819 | B1 * | 8/2012 | Treichler et al. | 702/57 |
| 8,421,495 | B1 * | 4/2013 | Anemikos et al. | 326/9 |
| 8,543,960 | B1 * | 9/2013 | Bickford | G06F 17/5045 716/101 |
| 8,719,763 | B1 * | 5/2014 | Bickford | G01R 31/31718 716/113 |
| 8,781,792 | B2 * | 7/2014 | Visweswariah | G06F 17/5045 702/117 |
| 2003/0120457 | A1 * | 6/2003 | Singh | H01L 22/20 702/181 |
| 2003/0229641 | A1 * | 12/2003 | Kamath | G06K 9/6282 |
| 2004/0082086 | A1 * | 4/2004 | Arabi | G01R 31/30 438/17 |
| 2004/0128090 | A1 * | 7/2004 | Read | G06F 1/3203 702/75 |
| 2004/0128566 | A1 * | 7/2004 | Burr | G06F 1/3203 713/300 |
| 2004/0128567 | A1 * | 7/2004 | Stewart | G06F 1/3203 713/300 |
| 2005/0107967 | A1 | 5/2005 | Patel et al. | |
| 2006/0246610 | A1 * | 11/2006 | Clougherty et al. | 438/14 |
| 2007/0255516 | A1 | 11/2007 | Patel et al. | |
| 2009/0058444 | A1 * | 3/2009 | McIntyre | G01R 31/31718 324/762.02 |
| 2011/0000829 | A1 * | 1/2011 | Linde et al. | 209/571 |
| 2011/0055793 | A1 | 3/2011 | Buck et al. | |
| 2011/0106497 | A1 * | 5/2011 | Visweswariah et al. | 702/182 |
| 2011/0191055 | A1 * | 8/2011 | Martinez | G01R 31/00 702/117 |

OTHER PUBLICATIONS

Boskin et al., "IC Performance Prediction From Electrical Test Measurements", 1992IEEE/SEMI Int'l Semicomductor Manufacturing Science Sumposium, p. 13-17.*
Datta et al., "Speed Binning Aware Design Methodology to Improve Profit Under Parameter Variations", 2006 Asia and South Pacific Conference on Design Automation, p. 712-717.*
Das et al., "Microarchitectures for Managing Chip Revenues Under Process Variations", IEEE Computer Architecture Letters, vol. 6, No. 2, Jul.-Dec. 2007, p. 29-32.*
Zolotov et al., "Voltage Binning Under Process Variation", 2009 IEEE/ACM International Conference on Computer-Aided Design of Technical Papers, p. 425-432.*
Zolotov et al., "Voltage Binning Under Process Variation",JCCAD San Jose, CA USA, pp. 1-8, 2009.

* cited by examiner

METHOD AND STRUCTURE FOR MULTI-CORE CHIP PRODUCT TEST AND SELECTIVE VOLTAGE BINNING DISPOSITION

BACKGROUND

The present disclosure relates to integrated circuit designs and, more particularly, to methods and systems that sort identical integrated circuit devices into voltage bins and test such integrated circuit devices to ensure that the voltage for each of the different voltage bins is sufficient for specific performance requirements of the elements in the integrated circuit.

Manufacturing variations may cause one or more parameters to vary between integrated circuits that are formed according to the same design. These variations can affect chip operating frequency (i.e., switching speed). For example, due to variations in the equipment, operators, position on a wafer, etc., a specific parameter may vary between chips built on the same wafer, chips built on different wafers in the same lot, and/or on chips built on different wafers in different lots. If this parameter is, for example, channel length, width, or threshold voltages, the transistors of each chip may be different such that the performance varies (e.g., faster or slower). Chips that are fabricated either at the "slow" end or the "fast" end of a process distribution (e.g., a process-temperature-variation (PVT) space) may not be desirable. For example, chips that are fabricated at the "slow" end of such a process distribution may not meet the desired performance specification (i.e., may not have a fast enough switching speed); whereas chips fabricated at the "fast" end of this process distribution may exhibit excessive power and leakage current. Thus, it is possible to run faster parts at lower voltage and slower parts at higher voltage, in order to reduce the maximum power for the distribution of parts. The division between the fast and slow portions of the distribution (i.e. the cutpoint), is generally determined a priori during the design phase.

SUMMARY

According to one embodiment herein, a method of sorting integrated circuit devices is disclosed. Integrated circuit devices are manufactured according to an integrated circuit design using manufacturing equipment. The integrated circuit design produces integrated circuit devices that are identically designed, but perform at different operating speeds caused by manufacturing process variations. The operating speeds of the integrated circuit devices are tested using a tester to establish maximum frequency and minimum frequency at maximum voltage and minimum voltage. The method sorts the integrated circuit devices after manufacture into relatively-slow integrated circuit devices and relatively-fast integrated circuit devices to classify the integrated circuit devices into different voltage bins. The method establishes a bin-specific voltage limit for each of the voltage bins needed for core performance at system use conditions. The method compares the bin-specific voltage limit to core minimum chip-level functionality voltage at system maximum frequency and minimum frequency specifications. The method correlates system design evaluation of design maximum frequency and design minimum frequency at design maximum voltage and design minimum voltage conditions with tester evaluation of tested maximum frequency and tested minimum frequency at tested maximum voltage and tested minimum voltage conditions. The method establishes a chip-specific functionality voltage limit for the integrated circuit device. The initial system voltage for all integrated circuit devices from one of the voltage bins is set at a greater of the bin-specific voltage limit and the chip-specific functionality voltage limit consistent with the tester evaluation conditions.

According to another embodiment herein, a method of identifying integrated circuit devices using selected voltage bins is disclosed. The method manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively-slow integrated circuit devices and relatively-fast integrated circuit devices to classify the integrated circuit devices into different voltage bins. The method establishes a bin-specific voltage limit for each supply voltage based on the integrated circuit design for each of the voltage bins, the bin-specific voltage limit being a minimum voltage needed for performance at operating conditions for the integrated circuit device. For each integrated circuit device in each of the voltage bins, the method establishes a chip-specific functionality voltage limit for each element in the integrated circuit design. The chip-specific functionality voltage limit is a minimum voltage needed for functionality of each the elements at design maximum and minimum operating speeds for the integrated circuit device. The method sets the initial system voltage based on the integrated circuit design for all integrated circuit devices in a voltage bin at a greater of the bin-specific voltage limit and the chip-specific functionality voltage limit.

According to a further embodiment herein, a system for selecting integrated circuit devices from selected voltage bins is disclosed. The system comprises a processor, a tester operatively connected to the processor, and a performance monitor operatively connected to the processor. The processor classifies integrated circuit devices manufactured from an identical circuit design into different voltage bins using the tester. Each of the voltage bins has a bin-specific voltage limit such that the bin-specific voltage limit for all integrated circuit devices in a given bin is set consistent with application conditions for the integrated circuit devices. The tester evaluates timing and voltage margins for each of the voltage bins. The processor compares the bin-specific voltage limit to core minimum chip-level functionality voltage at system maximum frequency and minimum frequency specifications using the performance monitor and determines a chip-specific functionality voltage limit for the integrated circuit device. The processor correlates system operating performance and core performance and performance monitor tester measurements. The processor identifies an initial system voltage for all integrated circuit devices from each of the voltage bins consistent with the tester and the performance monitor.

According to an additional embodiment herein, a non-transitory computer readable storage medium readable by a computerized device is disclosed. The non-transitory computer readable storage medium stores instructions executable by the computerized device to perform a method. According to the method, integrated circuit devices manufactured according to an integrated circuit design using manufacturing equipment are sorted. The integrated circuit design produces integrated circuit devices that are identically designed and perform at different operating speeds caused by manufacturing process variations. The integrated circuit devices are sorted after manufacture into relatively-slow integrated circuit devices and relatively-fast integrated circuit devices to classify the integrated circuit devices into different voltage bins. A bin-specific voltage limit for each supply voltage is established based on the integrated circuit design for each of the voltage bins. The bin-specific voltage limit is a minimum voltage needed for core functionality at operating conditions for the integrated circuit device. For each integrated circuit device in each of the voltage bins, a chip-specific functionality voltage limit is established for each element in the integrated circuit design. The chip-specific functionality voltage limit is a minimum voltage needed for functionality of each the elements at design maximum and minimum operating speeds for the integrated circuit device. Initial system voltage is set based on the integrated circuit design for all integrated circuit devices in a voltage bin at a greater of the bin-specific voltage limit and the chip-specific functionality voltage limit.

BRIEF DESCRIPTION OF THE DRAWINGS

The embodiments herein will be better understood from the following detailed description with reference to the drawings, which are not necessarily drawing to scale, and in which.

DETAILED DESCRIPTION

As mentioned above, the process of selective voltage binning can run faster parts at lower voltage and slower parts at higher voltage, in order to reduce the maximum power for the distribution of parts. However, conventional selective voltage binning assumes a certain non-changing performance/current leakage relationship, which may not always be correct. Indeed, some large variation in current leakage can occur. Because of this, customers are often advised that the binned devices may not precisely operate within their specific bin classification and, instead, each is provided with a +/−bin variation range (e.g., +/−3 bins). The embodiments described below address this issue and are able to supply binned devices that are guaranteed to operate within their specific voltage bin (without requiring a bin variation range).

Figure 1:
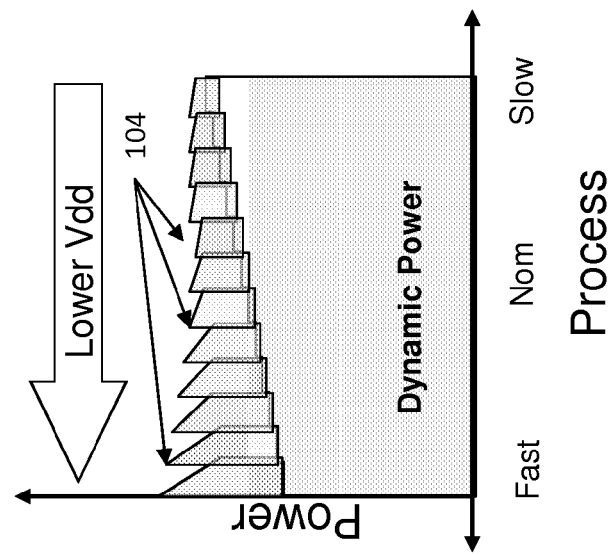
FIG. 1 is a chart illustrating the relationship between process speed and power usage for integrated circuits manufactured with the same process.
Figure 2:
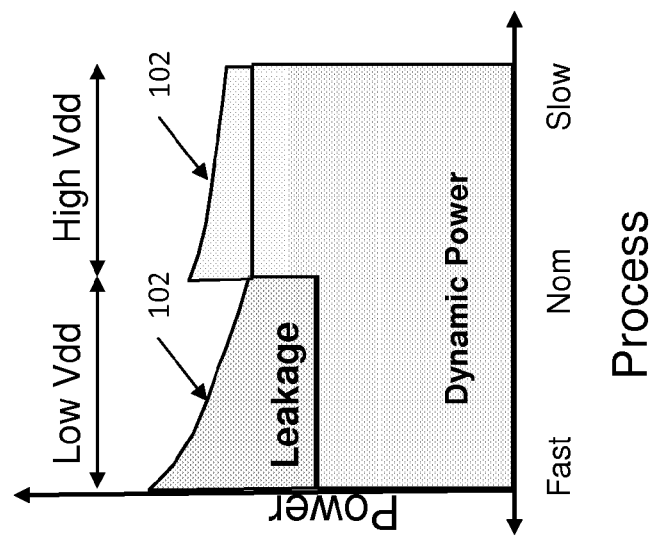
FIG. 2 is a chart illustrating the relationship between process speed and power usage for integrated circuits manufactured with the same process using a 2-bin selective binning process.
Figure 3:
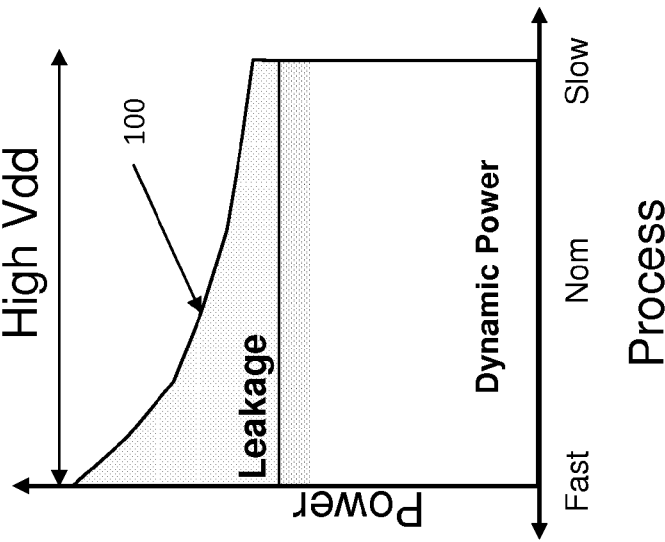
FIG. 3 is a chart illustrating the relationship between process speed and power usage for integrated circuits manufactured with the same process using a multi-bin selective binning process.

FIG. 1 is a chart illustrating the relationship between process speed and power usage for identically manufactured integrated circuit devices. FIG. 2 is a chart illustrating the relationship between process speed and power usage for integrated circuits manufactured with the same process using a 2-bin selective binning process, and FIG. 3 is a chart illustrating the relationship between process speed and power usage for integrated circuits manufactured with the same process using a multi-bin selective binning process.

Post-manufacturing voltage binning is a technique that is used to sort manufactured chips into bins based on whether they were fabricated at either the "slow" end or the "fast" end of a process distribution, and to vary the voltage requirements for the chips depending upon the bins they are assigned to in order to reduce maximum chip power. For example, FIG. 1 is a diagram illustrating the dynamic power and process speed for chips that are manufactured from a common design, but that are different because of different processing conditions that occur within acceptable manufacturing tolerances. Selective Voltage Binning (SVB) is also sometimes referred to as Adaptive Voltage Scaling (AVS).

In FIG. 1, the worst-case process range on curve 100 drives the required voltage for ultimately running the chip, creating an unnecessarily high operating voltage. However, with selective voltage binning shown in FIGS. 2 and 3, every chip is tested to measure operating speed and the chips are sorted into voltage bins accordingly. This reduces maximum chip power by running fast process chips at lower Vdd, as shown by curves 102 and 104. Thus, the devices are binned by process, and slow chips are operated at normal Vdd without change to slow-corner voltage, timing, and power (because slow-corner power is not limiting). However, as shown in FIGS. 2-3, fast chips are operated at reduced Vdd because the fast chips have speed to spare, and, at reduced Vdd, power is reduced.

For example, in a process-voltage-temperature space, the temperature and voltage of the chip may be fixed, and the leakage may be measured. If the leakage is above a specific cut point, then the chip is on the fast end of the process-voltage-temperature space and placed in a fast chip bin. If the leakage is below the cut point, then the chip is on the slow end of the process-voltage-temperature space and placed in a slow chip bin. The fast devices will be sorted into the "fast" bin, and will be utilized at lower voltages than the slow devices that are sorted into the "slow" bin. Because the fast devices have more leakage, the fast devices will consume more power. After the chips are sorted into bins according to the cut point, an optimal supply voltage (Vdd) for operating the chips in each bin is determined. Since both dynamic power consumption and static power consumption are exponentially proportional to the Vdd, a reduction in the required Vdd will reduce both dynamic and leakage power consumption and, thus, overall power consumption.

Selective voltage binning (SVB) procedures typically use several performance screen ring oscillator (PSRO) measurements to quantify chip performance after manufacturing. Voltage binning of individual integrated circuit devices is achieved by operating the integrated circuits at a plurality of required clock frequencies, and, for each of those frequencies, determining the minimum supply voltage level that produces a pass result for a series of applied test vectors. The bin voltage establishes a minimum voltage needed for performance of the integrated circuit device at normal operating conditions. Since this is done at a known voltage and temperature, the PSRO measurements are essentially a statement of the aggregate effect of a wide variety of different parameters upon that circuit. However, different types of circuits are typically present within a single chip, and some of these different types of circuits will exhibit different sensitivities to the variety of parameters. Thus, if a PSRO or some set of sample/reference logic paths are used to determine the bin voltage, there will likely be some circuits that inevitably track differently such that they are at a slightly different point in their best-case to worst-case performance range.

SVB is an open loop technique that provides a bin identifier associated with a voltage. AVS is a closed loop technique in which PSRO, or other performance monitor, is measured in the die and the results are used in the chip to adjust the voltage. While both techniques allow system power to be managed, they are not the same.

As mentioned above, the relatively-fast integrated circuit devices consume more power than the relatively-slow integrated circuit devices. The relatively-fast integrated circuit devices can be operated at a lower voltage to keep their operating speed and power consumption approximately equal to the relatively-slow integrated circuit device. Large cores, however, such as processors and logic devices, must be functional at system conditions. The method, according to embodiments herein, establishes a bin-specific voltage limit for each of the voltage bins needed for core performance at system use conditions. A core is a collection of integrated circuit elements (i.e. an embedded processor, a graphic processor, ADC, DAC, high-speed SERDES or PHY interface), designed to meet a designated specification, including performance, such as Fmax.

The required voltage relationship to the actual performance monitor, which is used for selective voltage binning, may vary due to different voltage thresholds of the library components or custom design layouts that are different as compared to standard cells. Setting the bin voltage with only PSRO information can result in functionality issues. Especially for slower parts, the distribution voltage may not be high enough to guarantee functionality of the library elements on the chip.

A standard cell library is a collection of low-level logic functions such as AND, OR, INVERT, flip-flops, latches, and buffers. These cells are realized as fixed-height, variable-width, full-custom cells. One aspect of such libraries is that they are of a fixed height, which enables them to be placed in rows, easing the process of automated digital layout. The cells are typically optimized full-custom layouts, which minimize delays and area.

A planned integrated circuit design as disclosed herein comprises a plurality of library circuit elements organized by circuit types. A library element is defined as a set of devices (i.e. transistors, diodes, resistors, capacitors, and inductors) wired together in a circuit, which perform a function. A circuit type is a set of library elements that have a common sensitivity to random defects. In the present disclosure, common sensitivity is defined by normalization factors, so library elements within a circuit type either have the same normalization factor or have normalization factors within a predetermined range of each other. Large library elements, such as cores, are composed of smaller and less complex library elements and can be represented by referencing the smaller and less complex library elements. Library elements of a given integrated circuit design share a common technology, one aspect of which is common minimum ground rules. Minimum ground rules define the smallest line widths and spaces or shapes that the devices may have.

As described above, one of the advantages of selective voltage binning is to reduce maximum chip power by running fast process chips at lower Vdd. Slow chips can be operated at normal Vdd; however, since fast chips have speed to spare, the fast chips can be operated at reduced Vdd. At reduced Vdd, the power consumption is reduced. Using this concept, multiple voltage bins enable lower ranges of Vdd on the fastest parts. This lowers the maximum power consumption.

Figure 4:
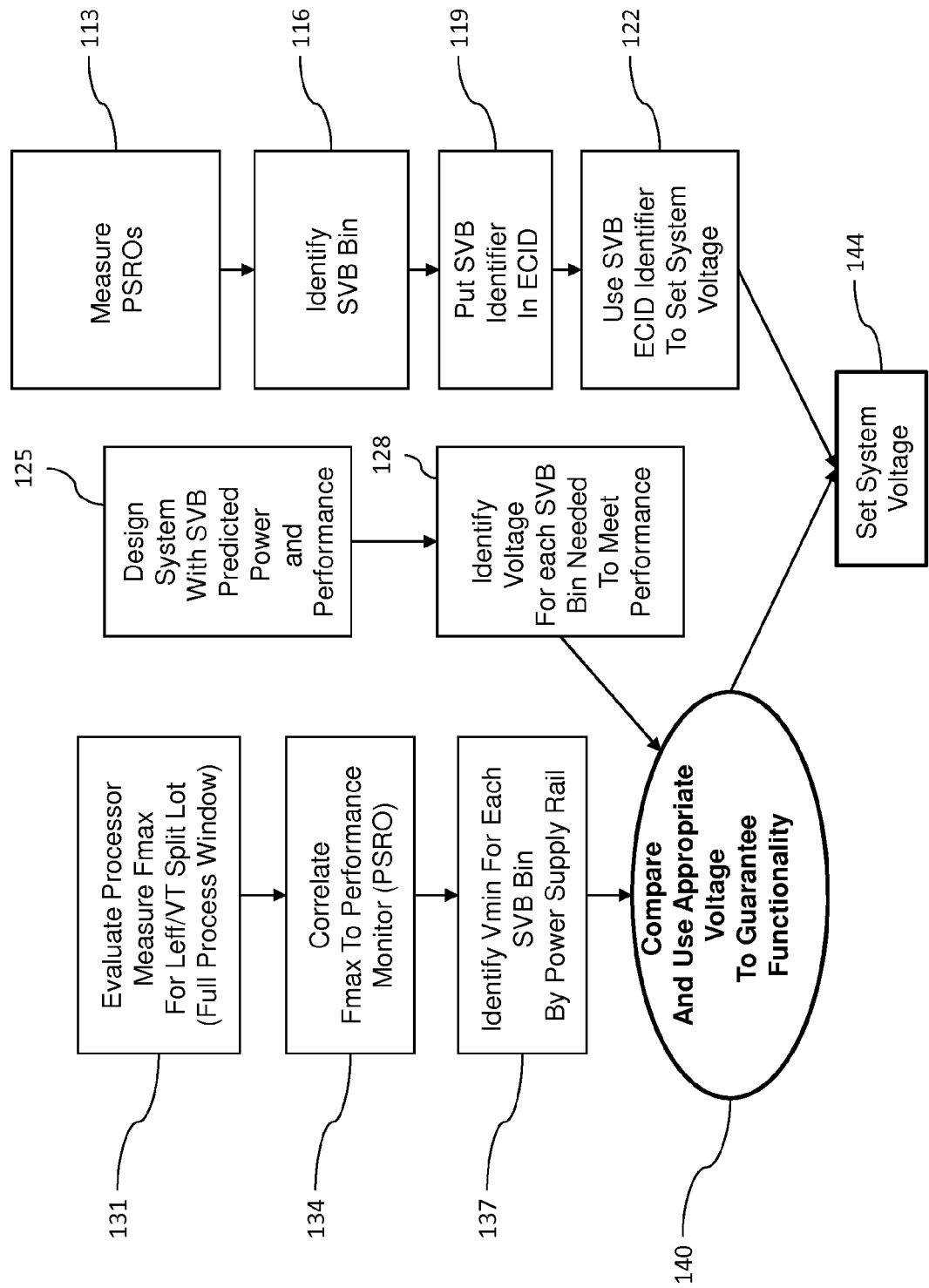
FIG. 4 is a block diagram illustrating embodiments herein.

Referring to FIG. 4, after the integrated circuit devices have been manufactured according to an integrated circuit design using manufacturing equipment, performance screen ring oscillator (PSRO) measurements are obtained to quantify chip performance 113. Based on the PSRO measurements, a number of SVB bins are identified 116. Each bin has a minimum voltage for circuit performance. The voltage for the bin is represented by an electronic chip identification data (ECID) that will be stored on the chip 119. Thus, the ECID value is burned into the device based on process, the customer reads the ECID (which can be tied to an input/output (IO)) to determine voltage levels on board, and the customer handles setting power supplies differently based upon ECID value 122. Further, timing closure runs are adjusted for SVB. Thus, the ECID defines the "performance sorting ring oscillator" (PSRO) and current leakage criteria for a particular bin on each part. A portion of this information includes the identification of the cut point to supply information to the voltage management unit.

The integrated circuit devices that have been manufactured according to an integrated circuit design using manufacturing equipment were designed for predicted power and performance 125. Based on the performance requirements, the voltage needed to meet performance for each SVB bin is identified 128.

According to embodiments herein, the minimum voltage to guarantee functionality is determined. First, evaluate the core Fmax measurements for Leff/Vt split over the entire lot for the full process window 131. In other words, for the design maximum speed of the device, measure the voltage threshold for the circuit element based on the effective line width.

Correlate Fmax to the performance monitor (PSRO) measurement 134. In other words, correlate the system design evaluation of maximum and minimum circuit switching speed at the designed minimum and maximum voltage conditions with actual test evaluation of maximum and minimum circuit switching speed at the designed minimum and maximum voltage conditions. This identifies specific performance requirements at the chip level.

Evaluate the minimum voltage per each voltage supply (Vdd, Vcs, I/O, Analog) needed to guarantee core functionality at system use conditions voltage 137. For selected memory and logic patterns, the voltage is varied to determine the voltage margin at the high and low end. For memory and logic patterns, the frequency is varied to determine the timing margin above go/no go point for each of these patterns.

Compare traditional selective to core minimum chip-level functionality voltage (inclusive of logic, array, I/O, and core circuits) at system Fmax and Fmin specifications 140. In other words, voltage bin voltage may not be high enough to ensure functionality of all elements in the integrated circuit design. According to embodiments herein, a voltage override may need to be determined for chip-level functionality of the integrated circuit device.

The initial system voltage for all devices in a bin is set for all chips in a given population at value consistent with application conditions 144. That is, for all integrated circuit devices from a given voltage bin, the system voltage is set at the greater of the bin-specific (SVB) voltage determined for chip performance and the chip-specific voltage determined for functionality. This resulting voltage will guarantee system performance and functionality.

According to an embodiment herein, all the required voltage bins are optimized for a given performance target while taking into account all the supply voltage rails and all the IP core interactions on a given integrated chip. The resulting voltages uses the minimum voltage to guarantee system functionality, which minimizes power requirements, meet system performance/functionality objectives, and minimizes voltage binning errors and overlaps.

Figure 5:
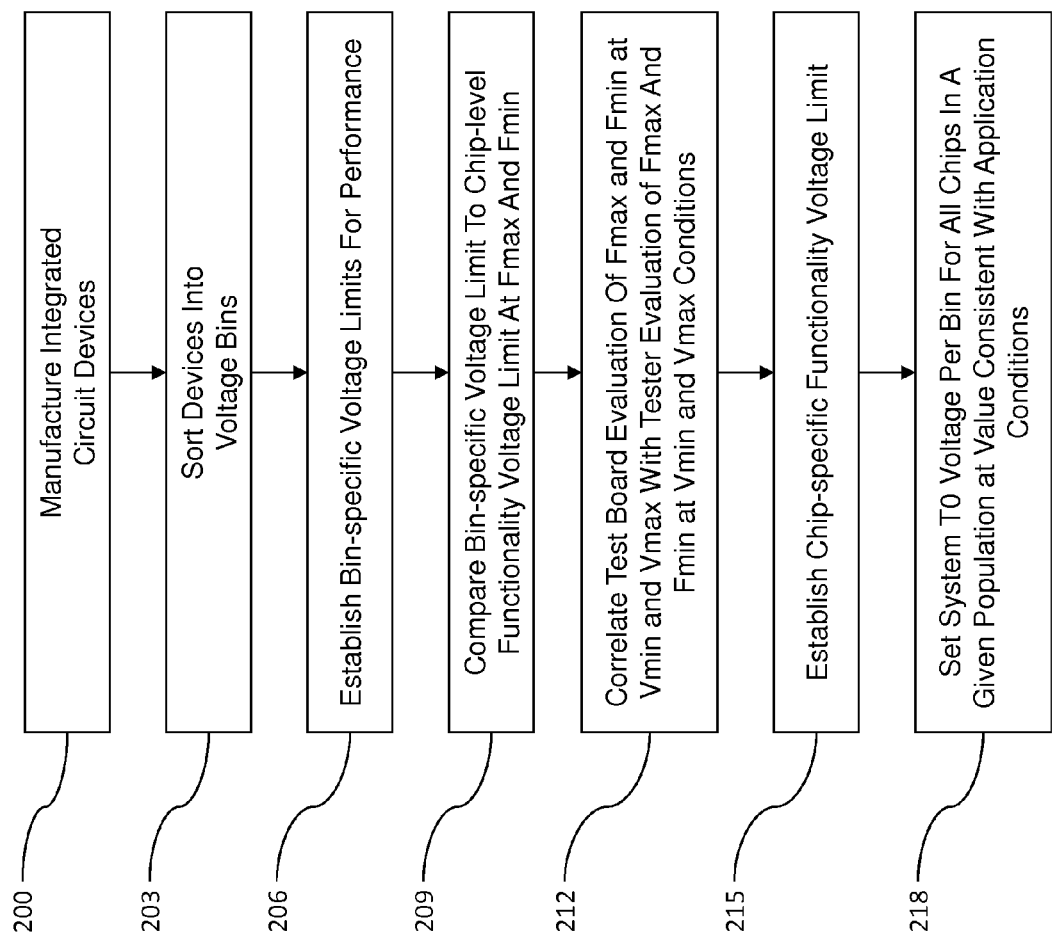
FIG. 5 a flow diagram illustrating embodiments herein.

FIG. 5 is a flow diagram illustrating an exemplary method herein that optimizes chip level functionality in an integrated circuit design. In item 200, this exemplary method manufactures integrated circuit devices according to an integrated circuit design using manufacturing equipment. The integrated circuit design produces integrated circuit devices that are identically designed, but perform at different operating speeds caused by manufacturing process variations In item 203, this exemplary method divides the integrated circuit devices after manufacture into relatively-slow integrated circuit devices and relatively-fast integrated circuit devices to classify the integrated circuit devices into different voltage bins. The relatively-fast integrated circuit devices consume more power than the relatively-slow integrated circuit devices. When establishing the limits for the different voltage bins, the operating speeds of the integrated circuit devices are tested using a tester to establish maximum frequency and minimum frequency at maximum voltage and minimum voltage.

In item 206, this exemplary method establishes a bin-specific voltage limit for each of the voltage bins needed for core performance at system use conditions.

The method compares the bin-specific voltage limit to core minimum chip-level functionality voltage at system maximum frequency and minimum frequency specifications, in item 209.

At 212, the method correlates system design evaluation of design maximum frequency and design minimum frequency at design maximum voltage and design minimum voltage conditions with tester evaluation of tested maximum frequency and tested minimum frequency at tested maximum voltage and tested minimum voltage conditions.

A chip-specific functionality voltage limit for the integrated circuit device is established, at 215.

Finally, at 218, the initial system voltage for all integrated circuit devices from one of the voltage bins is set at a greater of the bin-specific voltage limit and the chip-specific functionality voltage limit consistent with the tester evaluation conditions.

According to an embodiment herein, the method establishes a bin-specific voltage limit for each supply voltage based on the integrated circuit design for each of the voltage bins, the bin-specific voltage limit is the minimum voltage needed for performance at operating conditions for the integrated circuit device. For each integrated circuit device in each of the voltage bins, the method establishes a chip-specific functionality voltage limit for each element in the integrated circuit design. The chip-specific functionality voltage limit is the minimum voltage needed for functionality of each the elements at design maximum and minimum operating speeds for the integrated circuit device. The method sets the initial system voltage based on the integrated circuit design for all integrated circuit devices in a voltage bin at a greater of the bin-specific voltage limit and the chip-specific functionality voltage limit.

A system for selecting integrated circuit devices from selected voltage bins comprises a processor, a tester operatively connected to the processor, and a performance monitor operatively connected to the processor. The processor classifies integrated circuit devices manufactured from an identical circuit design into different voltage bins using the tester. Each of the voltage bins has a bin-specific voltage limit such that the bin-specific voltage limit for all integrated circuit devices in a given bin is set consistent with application conditions for the integrated circuit devices. The tester evaluates timing and voltage margins for each of the voltage bins. The processor compares the bin-specific voltage limit to core minimum chip-level functionality voltage at system maximum frequency and minimum frequency specifications using the performance monitor and determines a chip-specific functionality voltage limit for the integrated circuit device. The processor correlates system operating performance and core performance and performance monitor tester measurements. The processor identifies an initial system voltage for all integrated circuit devices from each of the voltage bins consistent with the tester and the performance monitor.

Figure 6:
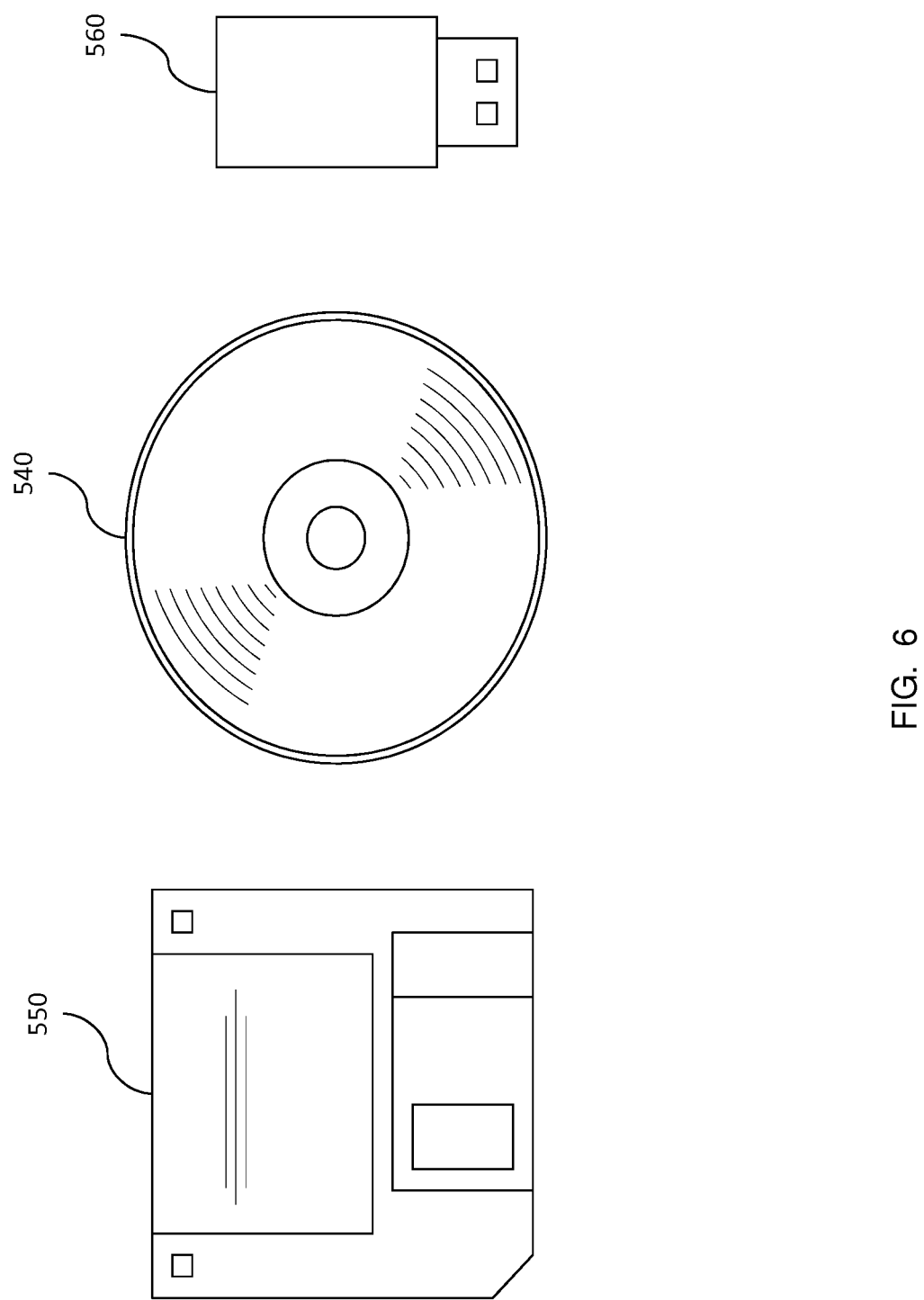
FIG. 6 is an illustration of articles of manufacture according to embodiments herein.

According to a further embodiment herein, an article of manufacture is provided that includes a computer readable medium having computer readable instructions embodied therein for performing the steps of the computer implemented methods, including but not limited to the method illustrated in FIG. 5. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. FIG. 6 illustrates exemplary articles of manufacture, such as, a portable compact disc read-only memory (CD-ROM) 540, a magnetic storage device 550, and a "plug-and-play" memory device 560, like a USB flash drive. Any of these devices may have computer readable instructions for carrying out the steps of the methods described above with reference to FIG. 5.

Aspects of the present disclosure are described herein with reference to flowchart illustrations and/or block diagrams of methods, apparatus (systems), and computer program products according to various embodiments. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

In case of implementing the embodiments herein by software and/or firmware, a program constituting the software may be installed into a computer with dedicated hardware, from a storage medium or a network, and the computer is capable of performing various functions if with various programs installed therein.

Figure 7:
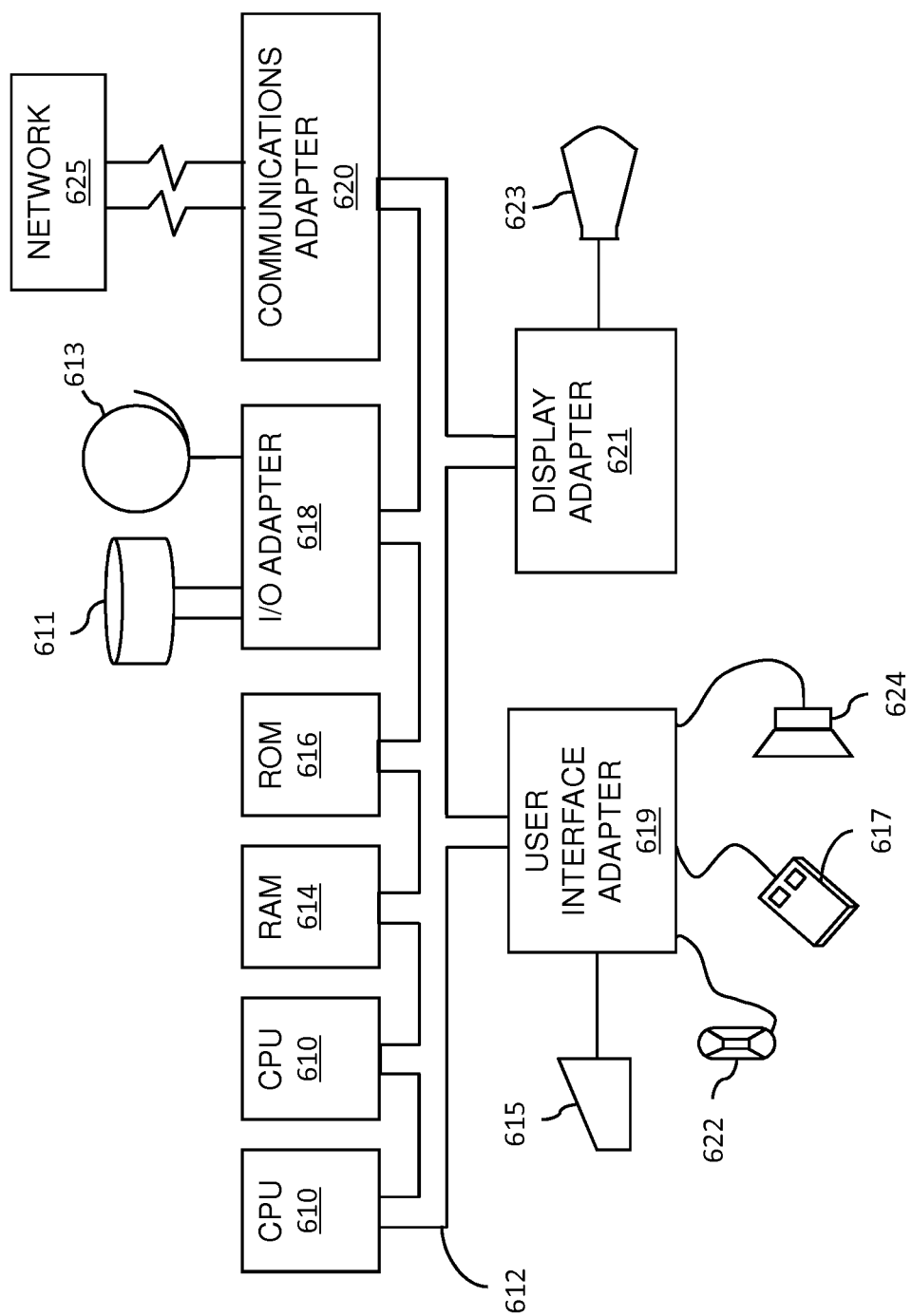
FIG. 7 is a schematic diagram of a hardware system according to embodiments herein.

A representative hardware environment for practicing the embodiments herein is depicted in FIG. 7. This schematic drawing illustrates a hardware configuration of an information handling/computer system in accordance with the embodiments herein. The system comprises at least one processor or central processing unit (CPU) 610. The CPUs 610 are interconnected via system bus 612 to various devices such as a random access memory (RAM) 614, read-only memory (ROM) 616, and an input/output (I/O) adapter 618. The I/O adapter 618 can connect to peripheral devices, such as disk units 611 and tape drives 613, or other program storage devices that are readable by the system. The system can read the inventive instructions on the program storage devices and follow these instructions to execute the methodology of the embodiments herein.

In FIG. 7, CPUs 610 perform various processing based on a program stored in a Read Only Memory (ROM) 616 or a program loaded from a peripheral device, such as disk units 611 and tape drives 613 to a Random Access Memory (RAM) 614. In the RAM 614, required data when the CPU 610 performs the various processing, or the like, is also stored as necessary. The CPU 610, the ROM 616, and the RAM 614 are connected to one another via a bus 612. An input/output adapter 618 is also connected to the bus 612 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 614, as necessary.

The system further includes a user interface adapter 619 that connects a keyboard 615, mouse 617, speaker 624, microphone 622, and/or other user interface devices such as a touch screen device (not shown) to the bus 612 to gather user input. Additionally, a communication adapter 620 including a network interface card such as a LAN card, a modem, or the like, connects the bus 612 to a data processing network 625. The communication adapter 620 performs communication processing via a network such as the Internet. A display adapter 621 connects the bus 612 to a display device 623, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium, such as the removable medium.

Those skilled in the art would appreciate that, the storage medium is not limited to the peripheral device having the program stored therein as illustrated in FIG. 7, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 616, a hard disk contained in the storage section 611, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.), or an embodiment combining software and hardware aspects, which may all generally be referred to herein as a "circuit," "module", or "system." Furthermore, aspects of the present disclosure may take the form of a computer program product embodied in one or more computer readable medium(s) having computer readable program code embodied thereon.

Computer program code for carrying out operations for aspects of the present disclosure may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    manufacturing integrated circuit devices according to an integrated circuit design using manufacturing equipment, said integrated circuit design producing integrated circuit devices that are identically designed and perform at different operating speeds caused by manufacturing process variations;
    testing operating speeds of said integrated circuit devices using a tester to establish maximum frequency and minimum frequency at maximum voltage and minimum voltage;
    sorting said integrated circuit devices into voltage bins based on said operating speeds, said voltage bins comprising at least a first voltage bin with relatively-slow integrated circuit devices and a second voltage bin with relatively-fast integrated circuit devices, each integrated circuit having a lowest operating voltage capable of sustaining a required frequency;
    establishing a bin-specific voltage limit for each of said voltage bins needed for core performance at system use conditions;
    comparing said bin-specific voltage limit to core minimum chip-level functionality voltage at system maximum frequency and minimum frequency specifications;
    correlating system design evaluation of design maximum frequency and design minimum frequency at design maximum voltage and design minimum voltage conditions with tester evaluation of tested maximum frequency and tested minimum frequency at tested maximum voltage and tested minimum voltage conditions;
    establishing a chip-specific functionality voltage limit for said integrated circuit device; and
    setting initial system voltage for all integrated circuit devices from one of said voltage bins at a greater of said bin-specific voltage limit and said chip-specific functionality voltage limit.

2. The method of claim 1, further comprising establishing limits for said voltage bins such that said relatively-slow integrated circuit devices and said relatively-fast integrated circuit devices consume a same maximum power.

3. The method of claim 1, further comprising embedding bin identification in said integrated circuit devices.

4. The method of claim 1, said establishing of said bin-specific voltage limit comprising design limits and limits based on empirical testing at operating conditions.

5. The method of claim 1, said establishing a chip-specific functionality voltage limit comprising design limits based on a library of elements in said integrated circuit design.

6. The method of claim 1, further comprising, during said testing, sensing a temperature of a digital circuit using a sensor and performing said testing only within a temperature operating range of said digital circuit.

7. A method comprising:
    manufacturing integrated circuit devices according to an integrated circuit design using manufacturing equipment, said integrated circuit design producing integrated circuit devices that are identically designed and perform at different operating speeds caused by manufacturing process variations;
    testing said operating speeds of said integrated circuit devices using a tester;
    sorting said integrated circuit devices into voltage bins after manufacture based on said operating speeds, said voltage bins comprising at least a first voltage bin with relatively-slow integrated circuit devices and a second voltage bin with relatively-fast integrated circuit devices;
    establishing a bin-specific voltage limit for each supply voltage based on said integrated circuit design for each of said voltage bins, said bin-specific voltage limit being a minimum voltage needed for performance at operating conditions for said integrated circuit device;
    for each integrated circuit device in each of said voltage bins, establishing a chip-specific functionality voltage limit for each element in said integrated circuit design, said chip-specific functionality voltage limit being a minimum voltage needed for functionality of each said element at design maximum and minimum operating speeds for said integrated circuit device; and
    setting initial system voltage based on said integrated circuit design for all integrated circuit devices in a voltage bin at a greater of said bin-specific voltage limit and said chip-specific functionality voltage limit.

8. The method of claim 7, further comprising establishing limits for said voltage bins such that said relatively-slow integrated circuit devices and said relatively-fast integrated circuit devices consume a same maximum power.

9. The method of claim 7, further comprising embedding bin identification in said integrated circuit devices.

10. The method of claim 7, said establishing of said bin-specific voltage limit comprising design limits and limits based on empirical testing at operating conditions.

11. The method of claim 7, said establishing a chip-specific functionality voltage limit comprising design limits based on a library of elements in said integrated circuit design.

12. The method of claim 7, further comprising, during said testing, sensing a temperature of a digital circuit using a sensor and performing said testing only within a temperature operating range of said digital circuit.

13. A system comprising:
a processor;
a tester operatively connected to said processor; and
a performance monitor operatively connected to said processor,
said tester testing operating speeds of integrated circuit devices manufactured from an integrated circuit design,
said processor sorting integrated circuit devices into voltage bins based on said operating speeds, said voltage bins comprising at least a first voltage bin with relatively-slow integrated circuit devices and a second voltage bin with relatively-fast integrated circuit devices, each of said voltage bins having a bin-specific voltage limit such that said bin-specific voltage limit for all integrated circuit devices in a given bin is set consistent with application conditions for said integrated circuit devices,
said tester evaluating timing and voltage margins for each of said voltage bins,
said processor comparing said bin-specific voltage limit to core minimum chip-level functionality voltage at system maximum frequency and minimum frequency specifications using said performance monitor, and determines a chip-specific functionality voltage limit for said integrated circuit device,
said processor correlating operating performance and core performance and performance monitor tester measurements, and
said processor identifying an initial system voltage for all integrated circuit devices from each of said voltage bins consistent with said tester and said performance monitor.

14. The system of claim 13, said timing and voltage margins having been generated and stored in a non-volatile storage medium during said testing.

15. The system of claim 13, said performance monitor comprising a performance screen ring oscillator.

16. The system of claim 13, said processor further embeds bin identification in said integrated circuit devices.

17. The system of claim 13, said bin-specific voltage limit comprising design limits and limits based on empirical testing at operating conditions.

18. The system of claim 13, said chip-specific functionality voltage limit comprising design limits based on a library of elements in said integrated circuit design.

19. The system of claim 13, further comprising a temperature sensor connected to said processor, said processor sensing a temperature of a digital circuit using said sensor said testing being performed only within a temperature operating range of said digital circuit during said testing.

20. A non-transitory computer readable storage medium readable by a computerized device, said non-transitory computer readable storage medium storing instructions executable by said computerized device to perform a method comprising:
sorting integrated circuit devices manufactured according to an integrated circuit design using manufacturing equipment, said integrated circuit design producing integrated circuit devices that are identically designed and perform at different operating speeds caused by manufacturing process variations, said integrated circuit devices being sorted after manufacture into voltage bins based on said operating speeds, said operating speeds being determined using a tester and said voltage bins comprising at least a first voltage bin with relatively-slow integrated circuit devices and a second voltage bin with relatively-fast integrated circuit devices;
establishing a bin-specific voltage limit for each supply voltage based on said integrated circuit design for each of said voltage bins, said bin-specific voltage limit being a minimum voltage needed for core functionality at operating conditions for said integrated circuit device;
for each integrated circuit device in each of said voltage bins, establishing a chip-specific functionality voltage limit for each element in said integrated circuit design, said chip-specific functionality voltage limit being a minimum voltage needed for functionality of each said element at design maximum and minimum operating speeds for said integrated circuit device; and
setting initial system voltage based on said integrated circuit design for all integrated circuit devices in a voltage bin at a greater of said bin-specific voltage limit and said chip-specific functionality voltage limit.

21. The non-transitory computer readable storage medium of claim 20, said method further comprising establishing limits for said voltage bins such that said relatively-slow integrated circuit devices and said relatively-fast integrated circuit devices consume a same maximum power.

22. The non-transitory computer readable storage medium of claim 20, said method further comprising embedding bin identification in said integrated circuit devices.

23. The non-transitory computer readable storage medium of claim 20, said establishing of said bin-specific voltage limit comprising design limits and limits based on empirical testing at operating conditions.

24. The non-transitory computer readable storage medium of claim 20, said establishing a chip-specific functionality voltage limit comprising design limits based on a library of elements in said integrated circuit design.

25. The non-transitory computer readable storage medium of claim 20, said method further comprising, during said testing, sensing a temperature of a digital circuit using a sensor and performing said testing only within a temperature operating range of said digital circuit.

* * * * *